United States Patent [19]

Maxham et al.

[11] Patent Number: 5,374,973
[45] Date of Patent: Dec. 20, 1994

[54] OPTICAL AMPLIFIER

[75] Inventors: Kenneth Y. Maxham; John M. Dugan, both of Richardson, Tex.

[73] Assignee: Alcatel Network Systems, Inc., Richardson, Tex.

[21] Appl. No.: 124,730

[22] Filed: Sep. 21, 1993

[51] Int. Cl.⁵ .............................. G02F 1/39
[52] U.S. Cl. ........................ 359/341; 359/177; 369/106
[58] Field of Search ............... 359/341, 177; 369/106

[56] References Cited

U.S. PATENT DOCUMENTS

| | | | |
|---|---|---|---|
| 4,954,786 | 9/1990 | Yamakawa et al. | 330/4.3 |
| 5,017,885 | 5/1991 | Saleh | 330/4.3 |
| 5,202,791 | 4/1993 | Kaede | 359/345 |
| 5,245,690 | 9/1993 | Aida et al. | 385/142 |
| 5,268,786 | 12/1993 | Matsushita et al. | 359/341 |

Primary Examiner—Mark Hellner
Attorney, Agent, or Firm—Vinson & Elkins

[57] ABSTRACT

Various optical amplifier configurations are disclosed. In one configuration, an optical amplifier provides an amplified output signal through use of a pumping device. The output signal is split to an output and a feedback input. The feedback signal is converted to a current which is sensed by a controller. The controller adjusts the amount of current to the pumping device in various instances. In one instance, the current is controlled to prevent overdriving the pumping device. In another instance, the current is controlled to maintain the output signal at a substantially constant level. In another configuration, the optical amplifier is coupled to a ratio computation block which measures the operating efficiency of the pumping device. Additional components detect an undesirable efficiency and provide a warning of the same.

25 Claims, 5 Drawing Sheets

OPTICAL AMPLIFIER

This invention relates in general to optical amplifiers, and more particularly to an optical amplifier configuration having a feedback system for maintaining a substantially constant amplified output, a detection circuit for preventing overdrive of the amplifier pump, and a detection circuit for detecting degradation of the pump efficiency and providing an indication thereof.

BACKGROUND OF THE INVENTION

Improvements in optical amplifiers have vastly enhanced the use of optical communication systems by increasing both data rates and the distances over which optical signals are transmitted. One significant advancement in such amplifiers is the development of optical amplifiers based on an optic fiber doped with a rare-earth element. This type of amplifier eliminates the need for complicated regenerator or "repeater" devices used in conventional systems to regenerate attenuated signals. Conventional repeaters require complex electronics to convert light into electric signals, amplify the signal, recover the data from the amplified signal, and then transform it back into light. In contrast, doped-fiber optical amplifiers do not interrupt the light signal, but merely add energy to it as described below. The components in the optical amplifier system are comparatively simple.

FIG. 1 illustrates a block diagram of a prior art optical amplifier designated generally at 10. The block diagram is a simplified illustration of commercially available amplifiers, such as the FiberGain ™, Module available from Corning Incorporated of Corning, N.Y., and identified as part number CL-10. Amplifier 10 includes an optical fiber 12 which is doped with a rare-earth element. In the preferred embodiment, the dopant is erbium. Other elements, such as neodymium, also have been used as dopants for the fiber, but erbium remains as the most prominent and successful. Optical fiber 12 provides an input 14 for receiving a light input signal, $L_{IN}$, and an output 16 for providing an amplified light output signal, $L_{OUT1}$. While not shown, optical fiber 12 is typically wound around a spool or like device.

Amplifier 10 further includes a light sourcing device which is typically a laser diode 18. While not shown, laser diode 18 is commonly housed in a small metallic case. Laser diode 18 couples power to the amplifier by "pumping" energy into optical fiber 12 and, hence, is also known as a pump laser diode. Specifically, the light provided by laser diode 18 is absorbed by the erbium atoms in fiber 12, pumping those atoms to a high-energy level. When a weakened $L_{IN}$ signal enters fiber 12, the excited erbium atoms transfer their energy to the signal in a process known as stimulated emission. As a result, the fiber 12 provides the amplified light output signal, $L_{OUT1}$. The anode of laser diode 18 provides an input 20 for receiving an amplification control current, $I_c$. For ease of illustration, the cathode of laser diode 18 is shown as grounded. It should be understood, however, that alternative configurations may be implemented for activating and deactivating laser diode 18.

Amplifier 10 also includes a pump power detector 22, which is typically a photodiode. Power detector 22 is proximate the sourcing laser diode 18 and, hence, provides an electrical signal, $I_{INT1}$, directly proportional to the light intensity $L_{PLD}$ of pump laser diode 18. Signal $I_{INT1}$ is detectable at output 24 of amplifier 10. In commercially available amplifiers, power detector 22 is often referred to as a "rear beam detector" due to its locational relationship to laser diode 18. Specifically, a small portion of the light emitted by laser diode 18 is reflected "rearwardly" to the detector, thereby giving the detector its name. As known in the art, the photodiode converts the light to an electrical signal (i.e., $I_{INT1}$) indicative of the intensity of the detected light.

While amplifier 10 of FIG. 1 provides numerous advantages over repeaters, developmental efforts continue in an attempt to increase optical system performance, including device reliability. For example, it is known in the art to include a feedback circuit which adjusts $I_c$ to maintain a constant light output signal, $L_{OUT1}$. Thus, as $L_{IN}$ changes in intensity or wavelength, $I_c$ is altered to maintain $L_{OUT1}$ at a fixed level. When $L_{IN}$ falls below a certain level, or is removed completely, the feedback system would try to greatly increase the magnitude of $I_c$. However, above a certain level of optical output power, diode 18 will be damaged. Therefore, such a system will include a current limit for $I_c$, limiting it to a value that does not produce a damaging level of optical output power. As diode 18 ages, its efficiency decreases, producing a lower level of optical output for a given $I_c$. This reduces the amplifier performance and reduces its useful lifetime. In one aspect of the present invention, however, it is realized that $I_c$ may be increased as long as the optical output is limited below the damage level. This increase of $I_c$ allows some compensation for the effect of ageing. This compensation extends the useful lifetime of diode 18, and thus the amplifier system.

It is therefore an object of the present invention to provide a system and technique for extending the useful lifetime of the laser diode by allowing the drive current to increase without exceeding its optical power damage level.

It is a further object of the present invention to provide a system and technique for analyzing the efficiency of a laser diode in an optical amplifier configuration.

It is a further object of the present invention to provide a system and technique for providing a warning as the efficiency of a laser diode in an optical amplifier configuration degrades.

It is a further object of the present invention to provide an amplifier configuration which maintains a substantially constant light output irrespective of fluctuations in light input and/or aging of the amplifier pump laser diode.

It is a further object of the present invention to provide a system and technique having an optical amplifier configuration with improved reliability and predictability.

Still further objects and advantages of the present invention will become apparent to those of ordinary skill in the art having reference to the following specification together with its drawings.

SUMMARY OF THE INVENTION

In one embodiment, the present invention includes an apparatus for amplifying an optical input signal. The apparatus includes an amplifier with an input for receiving, and an output for providing, optical signals. The amplifier also includes an optical fiber coupled between the input and output, and a pumping device for coupling an amplification optical signal to the optical fiber. Lastly, the amplifier includes a second input for receiving an amplification control signal to drive the pumping device, and an electrical output for providing an electrical signal indicative of the amplification optical signal provided by the pumping device. The amplified optical output signal is adjusted in response to both the optical input signal and the amplification control signal. The apparatus also includes control circuitry for producing the amplification control signal. In a first instance, the amplification control signal is maintained at a threshold value if the pumping device output reaches a predetermined value. In a second instance, the amplification control signal is adjusted at a level sufficient to maintain the amplified optical output signal at a substantially constant level.

In another embodiment, the present invention includes an apparatus having an optical amplifier like that described above, but using detection circuitry with the amplifier. The detection circuitry measures a ratio of the efficiency of the amplifier pump device, and provides an indication when the ratio passes beyond a desired value.

Various other embodiments, including methodologies arising from the above embodiments are also included within the present invention.

BRIEF DESCRIPTION OF THE DRAWINGS

For a more complete understanding of the present invention and its advantages, reference is now made to the following description taken in conjunction with the accompanying drawings, in which.

DETAILED DESCRIPTION OF THE INVENTION

The preferred embodiment of the present invention and its advantages are best understood by referring to FIGS. 1–4c of the drawings, like numerals being used for like and corresponding parts of the various drawings.

Figure 1:
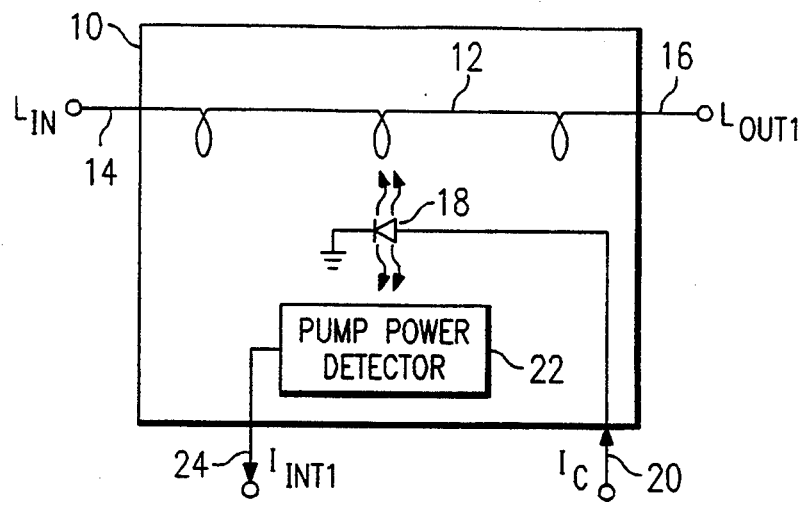
FIG. 1 illustrates a block diagram of a prior art erbium doped optical amplifier.
Figure 2:
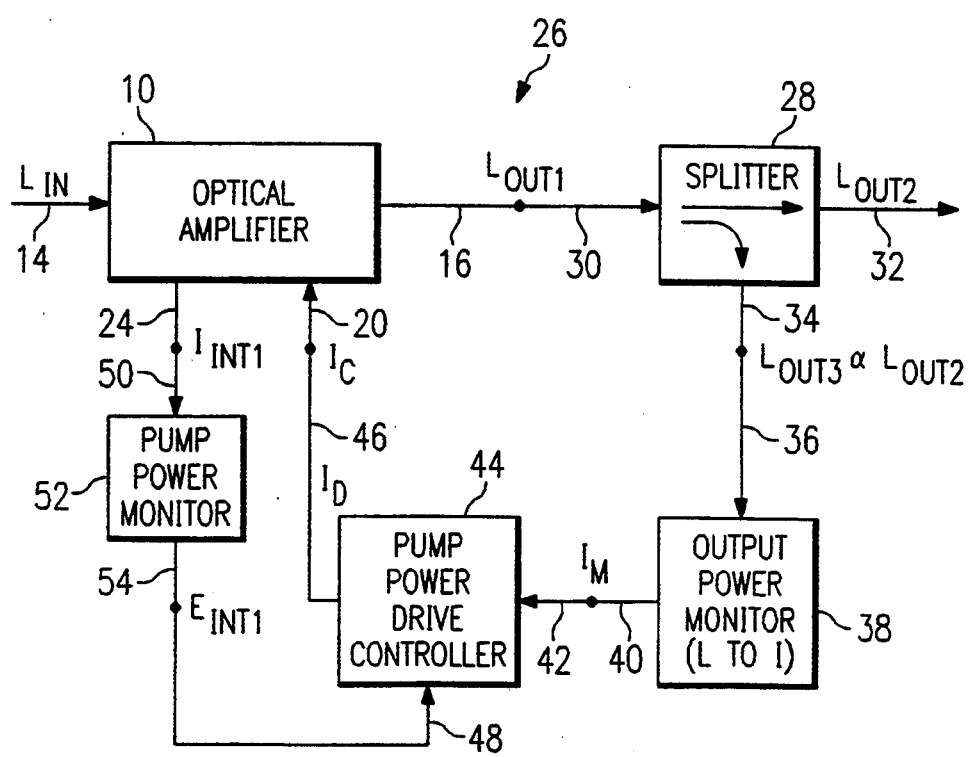
FIG. 2 illustrates one embodiment of the present invention, including the optical amplifier of FIG. 1, and having a feedback system for maintaining a substantially constant output and a detection circuit for preventing overdrive of the amplifier pump laser diode.

FIG. 2 illustrates a block diagram of an optical amplifier configuration in accordance with one embodiment of the present invention, and designated generally at 26. Configuration 26 includes the prior art optical amplifier 10, and its associated components, described in connection with FIG. 1, above. An optical splitter 28 is connected to output 16 to receive the amplified light output signal, $L_{OUT1}$, at its input 30. Optical splitter 28 passes a majority of the light signal to its first output 32 to provide a first light output signal, $L_{OUT2}$. Signal $L_{OUT2}$ is the amplified output signal for configuration 26 and, hence, is communicated to the desired destination of the system (e.g., along a fiber optic communication system). A small portion of $L_{OUT1}$ is split from the remainder to provide a second light output signal, $L_{OUT3}$ at a second output 34. Signal $L_{OUT3}$ is, therefore, proportional to signal $L_{OUT2}$. In the preferred embodiment, $L_{OUT2}$ represents approximately 99% of $L_{OUT1}$ while $L_{OUT3}$ represents the remaining 1% of $L_{OUT1}$.

Signal $L_{OUT3}$ is connected to an input 36 of an output power monitor 38. Output power monitor 38 converts the incoming light signal to an outgoing electrical signal, $I_M$. $I_M$, therefore, is an electrical signal having a magnitude proportional to the intensity of the incoming light signal, $L_{OUT3}$. Signal $I_M$ is provided via an output 40 to a first input 42 of a pump power drive controller 44. As described in greater detail below, controller 44 receives various electrical signals and provides a drive current, $I_D$. Drive current $I_D$ is provided via an output 46 to the input 20 of amplifier 10. Thus, by this connection, $I_c = I_D$. In other words, the output drive current $I_D$ powers the pump laser diode 18 of amplifier 10. Drive controller 44 also includes a second input 48, described in greater detail below.

As stated in connection with FIG. 1, amplifier 10 includes an output 24 which provides an electrical signal, $I_{IN1}$, directly proportional to the output intensity of the pump laser diode 18. Output 24 is connected to an input 50 of a pump power monitor 52. Pump power monitor 52 receives $I_{IN1}$ and "monitors" it by converting it to a voltage, $E_{INT1}$, that is proportional to $I_{INT1}$, and passing it onward to an output 54. Output 54 is connected to the second input 48 of drive controller 44. The signal passing through monitor 52 is changed in name from $I_{INT1}$ to $E_{INT1}$. Let it be noted that by appropriate selection of component values, $E_{INT1}$ is scaled to a convenient level for subsequent circuit functions.

The operation of configuration 26 is as follows. Under normal operating conditions, $L_{IN}$ is received by amplifier 10 and, by excitation from laser diode 18, is amplified to $L_{OUT1}$. Optical splitter 28, output power monitor 38, and drive controller 44 provide a feedback loop to adjust and maintain $L_{OUT1}$ (and, consequently, $L_{OUT2}$ at a substantially constant level. Particularly, drive controller 44 receives current $I_M$ indicative of the present light output for amplifier 10, $L_{OUT1}$. If the output is below a predetermined desired level, the pump drive current, $I_D$, is increased. Increasing $I_D$ correspondingly increases the pump power caused by laser diode 18 and, hence, increases the power of the light output signal, $L_{OUT1}$. This adjustment continues until $L_{OUT1}$ is at the desired constant output intensity. A typical constant output level is on the order of 10 to 15 dBm. Likewise, output intensity may be reduced when $L_{OUT1}$ exceeds the desired output intensity by reducing $I_D$.

In one aspect of the present invention, and as described briefly above, it has been recognized that the feedback system described above may pose a hazard to pump laser diode 18. Particularly, if the input light signal, $L_{IN}$, drastically decreases in intensity, or is removed completely, the feedback loop may cause a significant increase in drive current to laser diode 18. In other words, in an effort to maintain $L_{OUT1}$ at a constant intensity, an excessive drive current may be imposed on laser pump diode 18. This drive current attempts to force diode 18 to emit a corresponding amount of radiation which, at a certain level, may damage the device. To prevent this damage, however, pump power monitor 52 monitors the radiation output of the diode, and notifies drive controller 44 accordingly. Thus, drive controller 44 senses the amount of radiation emitted by diode 18 (i.e., an electrical signal corresponding to radiation intensity) and, if the radiation reaches a specified limit, drive controller 44 limits the drive current, $I_D$, to diode 18 and prevents the drive current from exceeding a safe level. The limit on intensity is commonly determined from the specifications concerning rear beam photodiode current accompanying the optical amplifier. A typical level of maximum desired rear beam current is on the order of 200 μA.

Note that the diode output power threshold feature has particular advantage to the present invention because, as described in greater detail below, additional drive current, $I_D=I_C$, is required by the laser diode as it ages and becomes less efficient. By monitoring the amount of output power of the diode, as opposed to an absolute value of its input current, the present invention provides the safety cutoff threshold while still allowing increased drive current as the diode ages. As a numeric example, consider a time $t_O$ where the laser diode requires 150 mA of current to output a desired fixed level of radiation. Thus, one could sense the drive current and limit it so that it did not exceed 150 mA. In the present invention, however, it is recognized that additional current will be necessary as the diode ages to obtain the same output power from the diode. Thus, the threshold is set by examining the output power of the diode rather than its drive current. Consequently, at a later time $t_1$, the diode may well require 200 mA to achieve the same output power. Under the present invention, the additional current is provided without restriction until the threshold output power is reached at which point current is restricted from further increase. Thus, the drive current is permitted to increase while the actual output power required of the laser diode is limited.

From the above, it should be appreciated that the embodiment of FIG. 2 provides a feedback loop for maintaining the light output of configuration 26 at a substantially constant and desired level. Further, the embodiment includes a safety feature whereby the amount of drive current to the pumping laser diode is controlled in response to the output power of the diode to protect the diode from damage and, hence, maintain the operability and reliability of the overall configuration.

Figure 3:
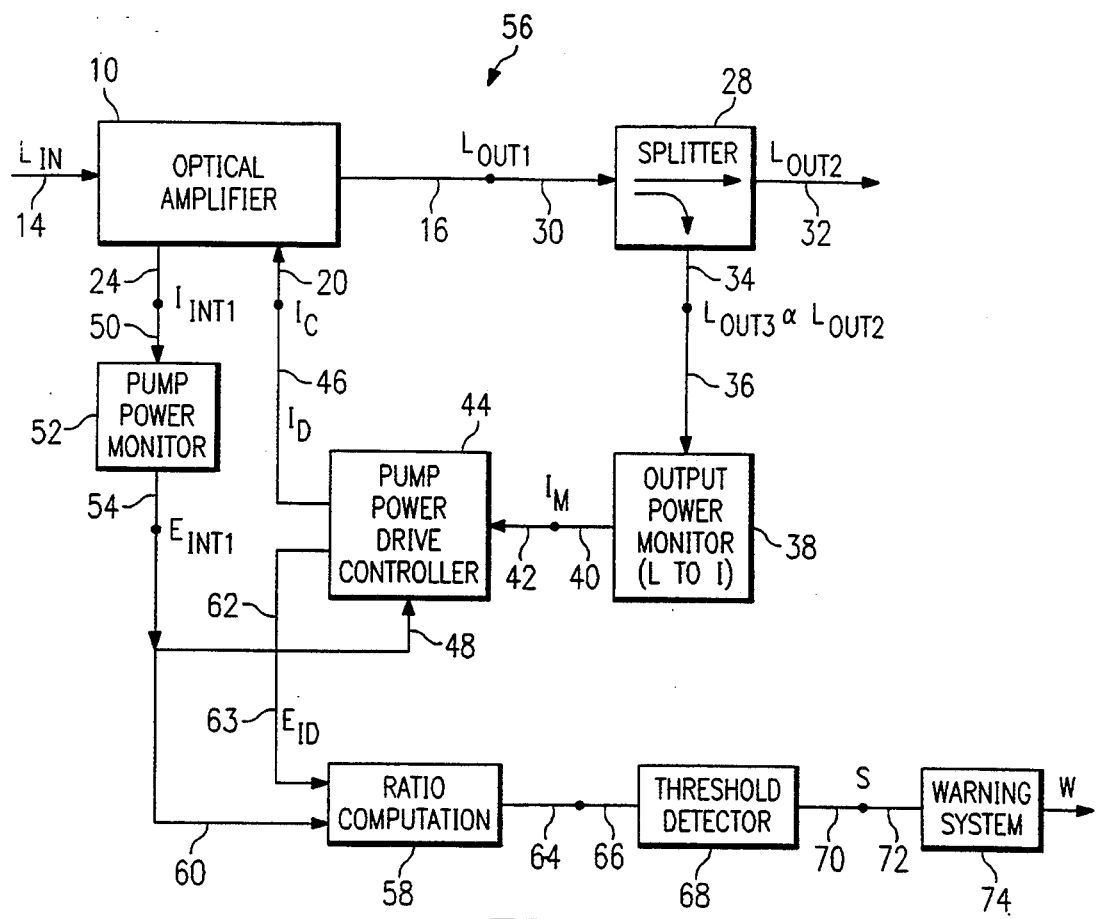
FIG. 3 illustrates another embodiment of the present invention, including the optical amplifier of FIG. 1, and having a detection circuit for detecting degradation of the pump laser diode efficiency and providing an indication thereof.

FIG. 3 illustrates a block diagram of an optical amplifier configuration in accordance with another embodiment of the present invention, and designated generally at 56. Configuration 56 includes each of the blocks and signals described in connection with FIG. 2 and, thus, like reference numerals are carried forward in FIG. 3. Configuration 56 shows an additional output 62 from drive controller 44. Output 62 is a voltage that is proportional to $I_D$ and will be referred to herein as $E_{ID}$. Let it also be noted that by appropriate selection of component values, $E_{ID}$ is scaled to a convenient level for subsequent circuit functions. Configuration 56 further includes a ratio computation block 58. One input 60 of ratio computation block 58 is connected to output 54 of pump power monitor 52 and, thus, receives the signal, $E_{INT1}$, representing the output intensity of the pump laser diode. Another input 63 of ratio computation block 58 is connected to output 62 of drive controller 44 and, thus, receives the signal $E_{ID}$ representing diode drive current, $I_D$. As described below, ratio computation block 58 computes a ratio of these signals to determine the operating efficiency of pump laser diode 18. In the preferred embodiment, this computation is performed using an analog multiplier/divider device.

The output 64 of ratio computation block 58 is connected to the input 66 of a threshold detector 68. Threshold detector 68 analyzes the ratio produced by computation block 58 to detect if it falls below a predetermined threshold. The output 70 of threshold detector is connected to the input 72 of a warning system 74. Warning system 74 provides a warning when threshold detector 68 has detected a ratio below the predetermined threshold.

Under normal operating conditions, configuration 56 operates in the same manner as configuration 26. Thus, the feedback loop maintains the configuration light output at a constant and desired level, and the amount of drive current to the pumping laser diode is controlled to produce the desired output, but limited to protect the diode from damage. The additional components of FIG. 3, however, monitor the efficiency of pump laser diode 18 and provide an indication when the efficiency falls beyond an acceptable level.

In particular, ratio computation block 58 measures the efficiency ratio of input power to output power for pump laser diode 18. In the preferred embodiment, this power ratio is reflected by current to the diode, as well as current representing the output intensity of the diode. The magnitudes of these currents are preferably scaled to achieve like dimensions. Thereafter, the efficiency ratio is:

$$E=E_{INT1}/E_{ID} \qquad \text{Eqn.1}$$

Note when laser diode 18 is new, the efficiency ratio is at its highest. However, as the diode ages, more drive current is required to achieve the same quantity of output radiation. The drive current alone, however, cannot be monitored to ascertain aging of the diode because it may increase for one of three reasons: (1) aging of diode 18; (2) a decrease in $L_{IN}$ (in this instance, $I_D$ is increased by controller 44 to maintain the output light signal, $L_{OUT1}$, at a constant level); or (3) a change in the wavelength of the signal $L_{IN}$. Thus, to determine the efficiency in the presence of a changing output from laser diode 18, a second parameter must be measured. In the preferred embodiment, this second parameter is the output power of laser diode 18 (translated to $E_{INT1}$).

For purposes of illustrating the efficiency calculation, consider the following example wherein arbitrary numbers are used to demonstrate the inventive embodiment. Assume at a time $t_O$, diode 18 is new. For a given input, $L_{IN}$, the efficiency rating is constant and, as an example, suppose E=5. In other words, for a given drive current, $I_D$, the intensity signal, $E_{INT1}$, is five times the drive current signal, $E_{ID}$. If laser diode 18 has not aged, and the drive current is increased, the intensity signal, $E_{INT1}$, will also increase, but will remain at five times the drive current signal. Thus, the efficiency ratio, E, remains constant. Similarly, if laser diode 18 has not aged, and the drive current is decreased, the intensity signal is also decreased but it still remains at five times the drive current signal. Accordingly, in either instance of a changing drive current, a constant efficiency ratio indicates a lack of aging of laser diode 18.

Next, assuming again E=5 at time $t_0$, consider a time $t_1$ when laser diode 18 has aged, that is, a given diode output radiation requires an increased amount of drive current compared to that required when the diode was new. At time $t_1$, therefore, E is less than five because the denominator of the efficiency ratio increases proportionately to the numerator at a rate greater than five. Note that this ratio result is true irrespective of fluctuations of level, or wavelength, in $L_{IN}$. For example, if $L_{IN}$ increases, $I_D$ (and $E_{ID}$) decreases but so does $I_{INT}$ (and $E_{INT1}$) at a factor of less than five. Similarly, if $L_{IN}$ decreases, $I_D$ (and $E_{ID}$) increases but, again, so does $I_{INT}$ (and $E_{INT1}$) at a factor of less than five.

From the above, it should be appreciated that the present invention provides for an efficiency evaluation of laser diode 18 as it ages. The evaluation occurs irrespective of fluctuations of level, or wavelength, in the system light input signal, $L_{IN}$. This signal independence is made possible by evaluating both the diode drive current and responsive radiation as opposed to monitoring solely the drive current. Note further that ratio computation block 58 provides its calculation to threshold detector 68. Threshold detector 68 determines when the ratio falls below an acceptable level. Typically, the threshold is set so that it is reached when the diode reaches approximately 75, % of its original efficiency. It is currently believed that the diode remains useful until operating at approximately 66% of its original efficiency. Thus, by detecting that the efficiency has degraded to 75% of its original value, and indicating the degradation via an alarm, a period of time exists between this detection and the end of the useful life of the diode, which occurs at 66% of its original efficiency value.

Note that threshold detector 68 may be constructed in various manners to determine when the efficiency has dropped to an undesirable level. Regardless of embodiment, threshold detector 68 must include a mechanism for evaluating efficiency as it decreases. Note, however, for many types of electronic components, the absolute value of a component parameter, such as the laser diode efficiency in the present invention, may vary from unit to unit. Accordingly, it is helpful to devise a mechanism which can track the parameter based on its relative value rather than its absolute value. In the present case, therefore, the relative change of this efficiency predicts the life stage for the diode. Life test data for laser diodes shows that when they are operated at a constant optical output power, the electrical current drive will increase as the efficiency decreases. In this example, the efficiency degradation increases at an exponential rate. Regardless of the shape of the graph of the degradation, it is known that ageing occurs in a predictable way and at a somewhat predictable rate. For example, let us say that life test data indicates that the component has used up 90% of its useful life when the efficiency ratio has decreased to 66% of its original value. As a ratio of present efficiency value to initial efficiency value, this would be a ratio of 0.66. Thus, by evaluating the ratios of present to original efficiency, one can determine that the diode has completed 90% of its useful life when the ratio reaches 0.66.

The present value/initial value ratio can be calculated using digital computational techniques. Another technique using analog methods involves a normalization gain adjustment, whereby the initial value is "normalized" or scaled to a nominal value, such as 1.0 volts; when the absolute scaled parameter has decreased to 66%, the normalized parameter would be 0.66 volts. This represents the ratio of the present value to the initial value, without a calculation. Using the normalized parameter for monitoring purposes eliminates the need to know (i.e., store) the initial absolute value, and eliminates a calculation. Particularly, in the example circuit to analyze diode efficiency and aging, normalization is accomplished using a potentiometer to normalize the initial value of efficiency to an initial normalized value (e.g., 1.0 volts) at the time of factory testing. Thereafter, the adjustment is never changed. In subsequent operation, the absolute value of the potentiometer output is sensed as a representation of relative change. Following the example above, when the potentiometer output reaches 0.66 volts, efficiency has decreased 66%. Accordingly, by examining the absolute value of the potentiometer output, and without performing an independent calculation, any percentage of decrease in efficiency may be ascertained. Thus, in the preferred embodiment, a threshold of 75% of original efficiency is detected when the potentiometer output equals 0.75 volts. It should be noted that while such a normalization technique is known to have been used for single value measurement (e.g., current), it is believed that it has not been used to evaluate a ratio measurement such as efficiency.

Once the threshold is reached, this determination is signalled to warning system 74. In response, warning system 74 provides a warning to an analyst of the system to give the analyst notice of impending optical signal degradation due to aging of diode 18. Typically, the warning involves sounding an audible alarm or illuminating a warning lamp. Further, this warning may be communicated to a location remote from the optical amplifier to give notice to a person at the remote location.

From the above, it should be appreciated that the embodiment of FIG. 3 provides advance notice of impending degradation of an optical amplifier output signal. Such notice permits the pumping device (e.g., diode) to be changed prior to any actual degradation of the optical amplifier output and, thus, enhances system reliability and predictability. For example, in a telecommunications system, the warning permits a controlled switching of traffic to another system while the optical amplifier or a pumping device is replaced. Without such a warning, the diode would subsequently reach its absolute performance limit, after which it would degrade rapidly and possibly render the optical amplifier inoperative. Consequently, communications traffic could be disrupted.

Figure 4A:
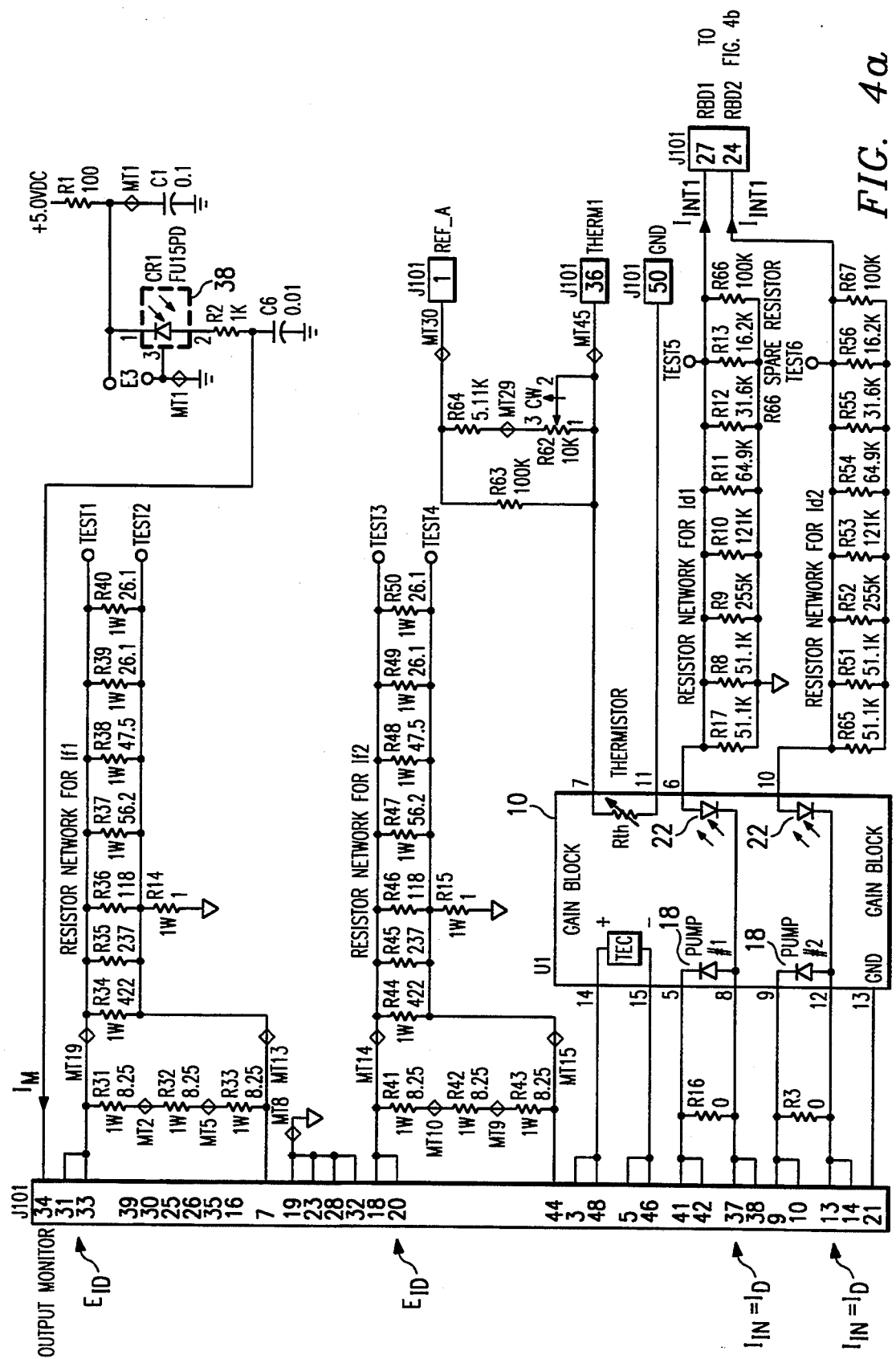
FIGS. 4a–c illustrate a schematic for implementing the embodiment of FIG. 3 in a dual laser diode configuration.
Figure 4B:
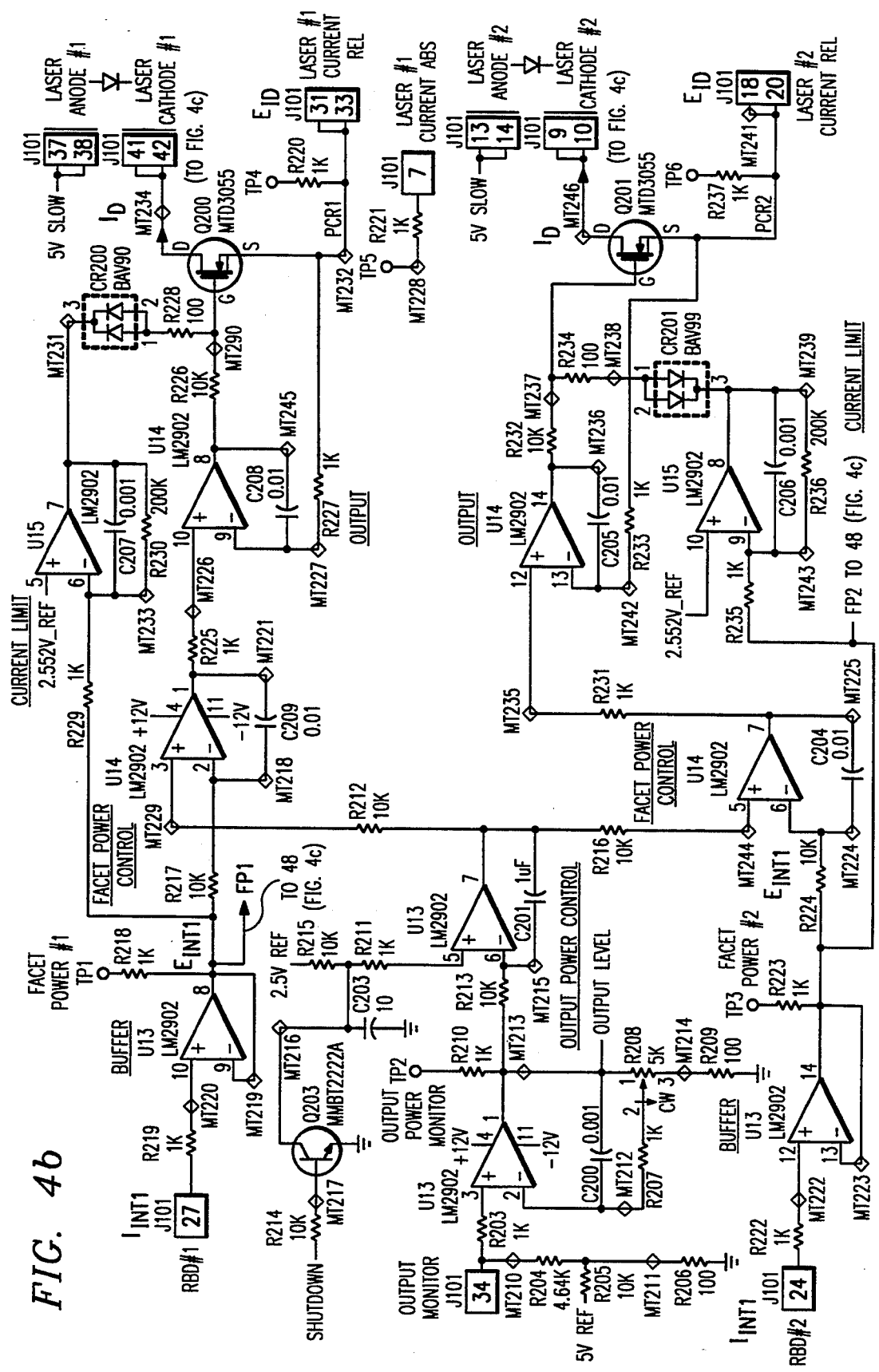
Figure 4C:
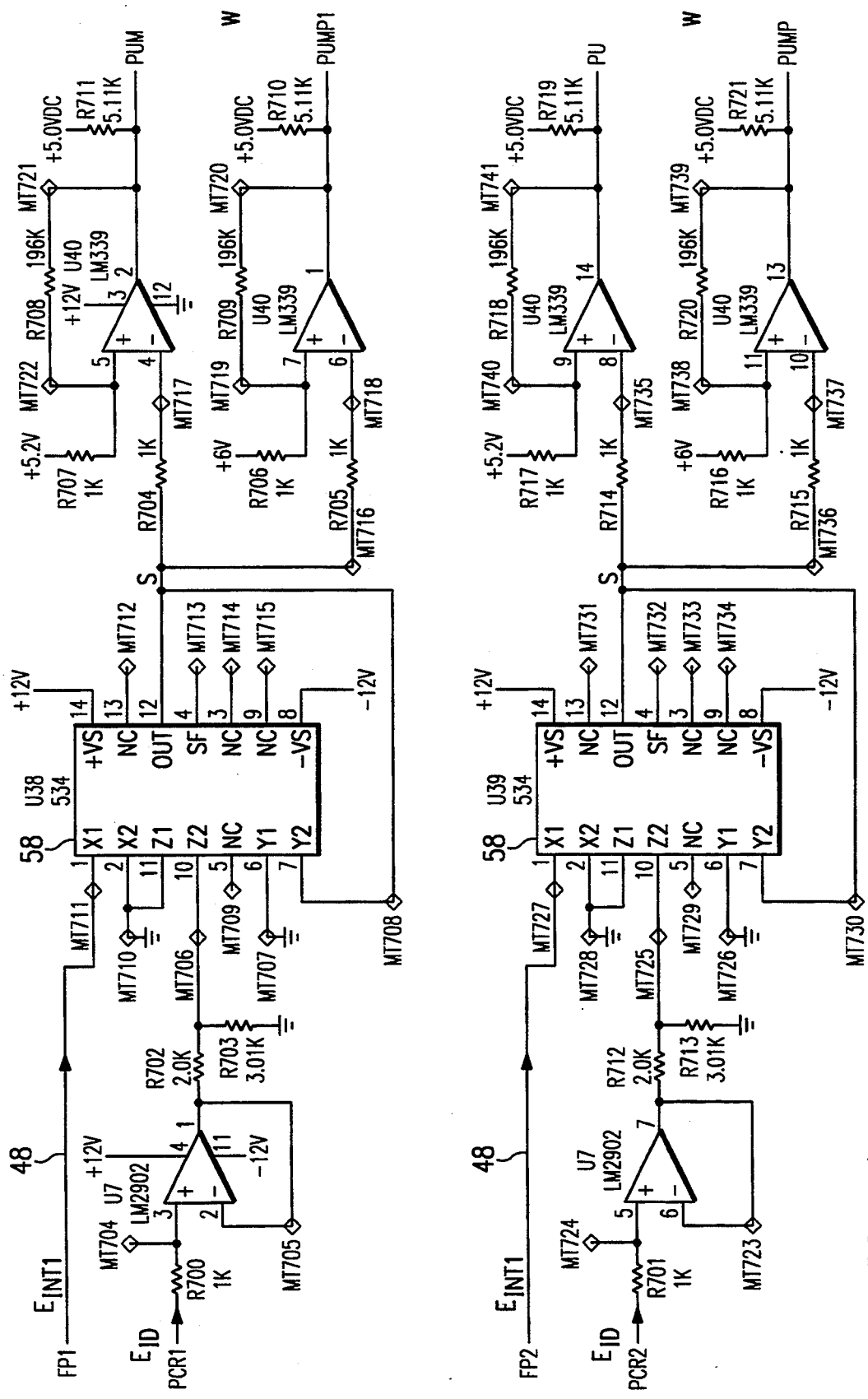

FIGS. 4a through 4c illustrate schematics in accordance with the present invention. Particularly, FIGS. 4a-c illustrate to one skilled in the art the currently best known circuitry for implementing the components shown in block form in FIG. 3. Reference numerals and signal denominations used in FIG. 3 are carried forward to FIGS. 4a-c. Note that Applicant submits FIGS. 4a-c to comply with the duties imposed upon it, and in no way intends the present invention to be limited thereto. In addition, the schematics of FIGS. 4a-c use various blocks/circuitry of the present invention in duplication to accommodate an optical amplifier having dual pump laser diodes.

Figure 5:
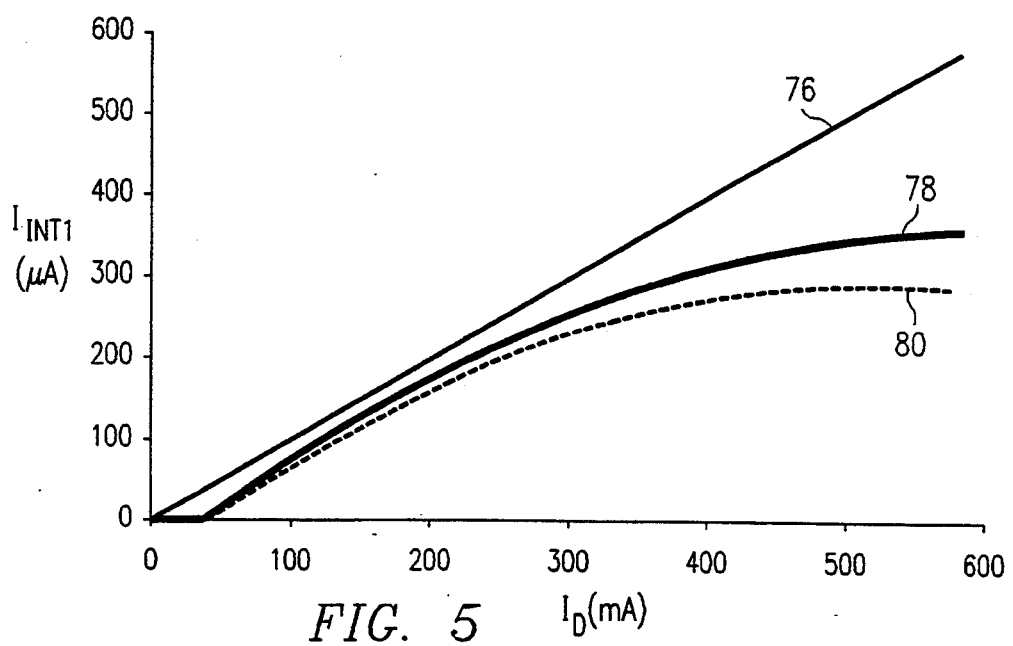
FIG. 5 illustrates a diode efficiency graph having $I_D$ as its x-axis and $I_{INT1}$ as its y-axis, and including plots of an ideal laser diode, a nonlinear new diode, and a nonlinear degraded diode.

Having described the embodiments above, note that additional considerations arise where a particular type of pump laser diode has a nonlinear efficiency curve, that is, a nonlinear relationship between its drive current $I_D$, and its output intensity electrical signal, $I_{INT1}$. Therefore, while the preferred embodiment contemplates a diode having a linear or near-linear efficiency curve, to better demonstrate the nonlinear considerations, FIG. 5 illustrates a diode efficiency graph having $I_D$ as its x-axis and $I_{INT}$ as its y-axis. The graph includes three plots, namely, an ideal laser diode plot 76, a nonlinear new diode plot 78, and a nonlinear degraded diode plot 80.

Ideal laser diode plot 76 illustrates the efficiency of a perfectly linear diode, thereby providing a fixed relationship between $I_D$ and $I_{INT1}$, regardless of the value of $I_D$. For example, disregarding units (i.e., mA or μA), in the example shown, the ratio of $I_{INT1}/I_D$ is one regardless of the value of $I_D$. Nonlinear new diode plot 78, however, illustrates a nonlinear relationship of $I_{INT1}/I_D$ for a fixed diode age (i.e., new), but over different values of $I_D$. Nonlinear degraded diode plot 80 also illustrates a nonlinear relationship of $I_{INT1}/I_D$, but demonstrates that $I_{INT1}$ decreases due to ageing for a given $I_D$ in comparison to plot 78.

Given the plots of FIG. 5, note that the Equation 1, which recall states $E = E_{INT1}/E_{ID}$, operates optimally only for a diode with an ideal linear efficiency plot, such as plot 76. In other words, for linear plot 76, at any age, the efficiency ratio, E, is the same value regardless of $I_D$ because $I_{INT1}$ changes in direct proportion to ID (and, thus, $E_{INT1}$ changes in direct proportion to $E_{ID}$). Note, however, because plot 78 is nonlinear, Equation 1 yields a different result depending on the value of $I_D$, even though plot 78 represents a new diode at a fixed age. Consequently, depending on the curvature of the nonlinear plot (i.e., the lack of linearity for a given diode), Equation 1 may indicate a change in efficiency which is believed to be due to ageing but, in fact, is merely due to the nonlinearity of the efficiency curve. Such results may be unacceptable in certain circumstances.

In view of the above, the present invention further includes an additional embodiment to accommodate the possibility of nonlinear laser diodes (or alternative pumping devices) in an optical amplifier. Particularly, referring back to FIG. 3, the additional embodiment adds a microprocessor to ratio computation block 58. The microprocessor, along with any additional supportive circuitry such as a memory, stores plot 78 for the nonlinear new diode. Note that plot 78 is preferably derived by sweeping the amount of drive current to the laser diode (i.e., spanning the input value over a range, such as 0 to 500 mA) and measuring the corresponding diode output intensity.

Thereafter, as the diode ages, a normalized laser efficiency, NLE, is measured according to the following:

$$NLE = E_{actual}/E_{new} \qquad \text{Eqn 2}$$

where, $E_{actual}$ is the present laser efficiency ratio, according to Equation 1, at the present operating point defined by the present $E_{ID}$ and the present $E_{INT1}$; and $E_{new}$ is the laser efficiency ratio, according to Equation 1, for the present $E_{ID}$ but when the laser was new (i.e., according to the plot 78 stored by the microprocessor).

Thus, Equation 2 normalizes the actual present efficiency in terms of the efficiency of the diode when it was new by: first, determining the efficiency of the aged diode at the present drive current and present intensity output; and, second, comparing that efficiency to the efficiency of the diode when it was new for the same drive current, $I_D$. Because Equation 2 accounts for the specific present drive current, any nonlinearity at other drive currents is irrelevant and, hence, efficiency is properly calculated at any diode age regardless of efficiency nonlinearities. Thus, the value of NLE will be 1.00 over the entire operating drive current range when the diode is new. As the laser diode ages (degrades), NLE will decrease, and an NLE value of 0.75 (i.e., indicating 75% efficiency) would be detected by detector 68 for triggering warning system 74.

Notwithstanding the embodiments described for both linear and nonlinear diodes, note that Equation 2 also may be used without storing the entire response curve of the diode, but with less accurate results. Particularly, $E_{new}$ in Equation 2 may be established at a fixed $I_D$ rather than having to ascertain it for all possible values of $I_D$ as shown by plots 78 and 80. For example, $E_{new}$ may be measured at an arbitrary value of $I_D$, such as 350 mA, when the laser diode is new. Thereafter, Equation 2 may be calculated using the initially determined value of $E_{new}$ at the 350 mA level. This method is less sophisticated than calculating $E_{new}$ for a present drive current $I_D$ and, thus, less accurate.

Note also, while the present invention has been described in detail, various substitutions, alterations and modifications may be made to it by a person having skill in the art without departing from the claimed invention. For example, while a laser diode provides the pumping effect in the preferred embodiment, alternative pumping devices could be used in a similar manner and monitored for efficiency. As another example, while the efficiency measurement is analog in this example, digital computational techniques likewise could be used. As yet another example, the reciprocal of the ratio could be determined with an expectation that the ratio will increase, rather than decrease, as time passes. As still another example demonstrated above, various blocks/circuitry of the present invention may be duplicated to accommodate an optical amplifier having more than one pump laser diode. As still another example, parameters other than currents (e.g., voltages) could be analyzed for device protection and/or efficiency determinations. As a final example, when the amplified output is maintained constant, a parameter other than one associated with the pumping device may be analyzed along with the power to the pumping device to determine efficiency. Thus, for a fixed amplifier output, power to the pumping device and signal strength input to the amplifier may serve as an alternative, with the relationship between the two parameters changing as the pumping device ages and becomes less efficient. Note, also, the present invention has various uses, such as long distance communications and local-area networks. Each of these examples and uses, as well as those readily ascertainable, demonstrate the flexibility of the present invention, as defined by the following claims.

What is claimed is:

1. An apparatus for amplifying an optical input signal, comprising:
   an amplifier comprising:
      a first input for receiving said optical input signal;
      an output for providing an amplified optical output signal;
      an optical fiber coupled between said first input and said output;
      a pumping device for providing and coupling an amplification optical signal to said optical fiber;
      a second input for receiving an amplification control signal; and an electrical output for providing an electrical signal indicative of said amplification optical signal provided by said pumping device, wherein said amplified optical output signal changes in response to said optical input signal and said amplification control signal; and control circuitry coupled to said electrical output for receiving said electrical signal, said control circuitry for producing said amplification control signal, wherein in a first instance said control circuitry limits said amplification control signal to prevent said amplification optical signal from exceeding a fixed threshold value if said electrical signal indicative of said amplification optical signal reaches a predetermined value and regardless of a decrease in said optical input signal during said first instance.

2. The apparatus of claim 1 wherein said control circuitry is further coupled to said output of said amplifier, wherein in a second instance said amplification control signal is adjusted at a level sufficient to maintain said amplified optical output signal at a substantially constant level.

3. The apparatus of claim 2 wherein said control circuitry coupled to said output of said amplifier comprises:

apparatus coupled to said output of said amplifier for producing an electrical output signal indicative of the magnitude of said amplified optical output signal; and circuitry coupled to receive said electrical output signal and for producing said amplification control signal, wherein said amplification control signal is adjusted due to fluctuations in said amplified optical output in order to maintain said amplified optical output signal at a substantially constant level.

4. Optical amplifier pump monitor apparatus comprising, in combination:

optical amplifier including signal input, amplified signal output and signal power output;

laser pump connected to said optical amplifier and further including control input means and a pump monitor output indicative of the power output by said laser pump;

feedback means connecting said signal output to said control input means of said laser pump for maintaining the amplitude of said signal output substantially constant regardless of variations in signal amplitude applied to said signal input of said optical amplifier; and computation means, connected to said feedback means and said pump monitor output, for monitoring the ratio of power to, and output from, said laser pump and outputting a pump efficiency signal.

5. The apparatus of claim 4 wherein said feedback means is further connected to said pump monitor output, and wherein said first feedback means limits current to said control input means when the power output at said pump monitor output reaches a predetermined value.

6. An apparatus for amplifying an optical input signal, comprising:

an amplifier comprising:
a first input for receiving said optical input signal;
an output for providing an amplified optical output signal;

an optical fiber coupled between said first input and said output;
a pumping device for coupling an amplification optical signal to said optical fiber; and
a second input for receiving an amplification control signal, wherein said amplified optical output signal is adjusted in response to said optical input signal and said amplification control signal;
an electrical output for providing an electrical pump signal indicative of said amplification optical signal; and
computation circuitry coupled to receive said amplification control signal and said electrical pump signal and for measuring a ratio of said amplification control signal to said electrical pump signal.

7. The apparatus of claim 6 and further comprising a threshold detection circuit coupled to said detection circuitry, wherein said threshold detection circuit provides a responsive action in response to said ratio passing a predetermined value.

8. The apparatus of claim 7 and further comprising a warning system for providing a warning in response to said responsive action by said threshold detection circuit.

9. The apparatus of claim 6 and further comprising control circuitry coupled to said electrical output for producing said amplification control signal, wherein in a first instance said amplification control signal is maintained at a threshold value if said electrical signal indicative of said amplification optical signal reaches a predetermined value.

10. The apparatus of claim 9 wherein said control circuitry is further coupled to said output of said amplifier, wherein in a second instance said amplification control signal is adjusted at a level sufficient to maintain said amplified optical output signal at a substantially constant level.

11. A method of allowing power supplied to a pumping device to be increased when efficiency of the pumping device decreases, and at the same time preventing damage to a pumping device within an optical amplifier configuration having an output light signal, comprising the steps of:

receiving an optical input signal into a fiber;
inputting power to said pumping device;
outputting radiation from said pumping device to said fiber;
monitoring said radiation output by said pumping device; and
limiting power input to said pumping device to prevent said radiation output from said pumping device from exceeding a fixed threshold value when the monitored radiation from said pumping device reaches a predetermined value, regardless of a decrease in said optical input signal.

12. The method of claim 11 wherein said pumping device comprises a laser diode, and wherein:
said step of monitoring comprises monitoring the radiation output by the diode; and
said step of adjusting power comprises adjusting drive current to the laser diode to a first level when the monitored radiation exceeds a predetermined value.

13. The method of claim 12 and further comprising the steps of:
monitoring the magnitude of said output light signal; and adjusting said drive current to a second level to maintain said output light signal at a substantially constant level.

14. The method of claim 13 wherein said first recited adjustment step has a higher priority than said second recited adjustment step.

15. A method of determining aging of a laser diode within an optical amplifier configuration having an input for receiving a current to drive said laser diode, comprising the steps of:
monitoring the amplitude of current supplied to said laser diode;
monitoring a parameter associated with said optical amplifier configuration;
comparing said amplitude of current with said parameter to determine a comparison indication; and
generating a response when said comparison indication is beyond a predetermined value.

16. The method of claim 15 wherein said parameter comprises the power output by said laser diode, and wherein said comparing step comprises:
determining said comparison indication as a ratio using said amplitude of current and a current representative of said power output; and
wherein said step of generating a response comprises evaluating whether said ratio is beyond a predetermined value.

17. A method of determining aging of a pumping device within an optical amplifier configuration having an input for receiving a current to drive said pumping device, comprising the steps of:
monitoring the power input to said pumping device;
monitoring the power output by said pumping device;
determining a ratio of said power input to said power output; and
evaluating whether said ratio is beyond a predetermined value.

18. A method of providing supply current to a laser diode within an optical amplifier configuration having an output light signal, comprising the steps of:
monitoring the radiation output by the diode;
limiting drive current to the laser diode to a first level when the monitored radiation reaches a predetermined value;
monitoring the magnitude of said output light signal;
adjusting said drive current to a second level to maintain said output light signal at a substantially constant level, wherein said first recited limiting step has a higher priority than said second recited adjustment step;
monitoring the amplitude of said drive current;
monitoring the power output by said laser diode;
determining a ratio using signals representing said amplitude of current and said power output; and
evaluating whether said ratio is beyond a predetermined value.

19. The method of ascertaining the degradation of laser pump efficiency when used with an optical amplifier having variable signal amplification ratios comprising the steps of:
monitoring the input current of a laser pump as an indication of laser input power;
monitoring rear beam photodetector diode current as an indication of laser output power; and
outputting a signal as a laser pump efficiency degradation warning when the ratio of said input current and said rear beam photodetector diode current passes through a given value.

20. The method of providing a warning of impending failure of a pump laser diode comprising part of a regulated output optical amplifier apparatus, the method comprising the steps of:
storing an initial value of a time of use degrading parameter of a laser diode;
continuously monitoring said time of use degrading parameter with use;
comparing said initial value with the present value of said time of use degrading parameter; and
providing a warning signal when the degradation exceeds a given percentage change.

21. The method of determining that the useful life of a pump laser diode is nearly over comprising the steps of:
detecting the pump laser diode electrical drive level as a first signal F1;
detecting the optical output of the pump laser diode as a second signal F2;
calculating the efficiency of the pump laser diode as the ratio of F2 to F1; and
generating an alarm when the efficiency becomes less than a predetermined value.

22. The method of claim 21, comprising the additional steps of:
normalizing said ratio of F2 to F1 at a first instance; and
evaluating the absolute value of said ratio of F2 to F1 at a second instance following said first instance, wherein said absolute value alone represents the percent change of said efficiency.

23. The method of increasing the useful life of a pump laser diode in an optical amplifier circuit comprising the steps of:
controlling the pump power supplied to a pump laser diode as part of a feedback circuit to attempt to maintain a constant optical output power with changes in at least one of input signal level, input signal wavelength, and degradation of circuit components;
detecting the level of pump power output of said pump laser diode;
regulating said feedback circuit, in accordance with said detection step, to prevent the feedback circuit from applying a drive current sufficient to force the desired constant optical output power beyond a threshold;
monitoring the efficiency of said pump laser diode: and
raising the drive current as a function of the decrease in efficiency of the pump laser diode as determined by the monitoring step.

24. A method of determining aging of a laser diode within an optical amplifier configuration having an input for receiving a drive current to drive said laser diode, and having an output providing an intensity signal representative of output power of the laser diode, the method comprising the steps of:
first determining an initial efficiency which varies in accordance with the drive current, wherein said first determining step comprises:
supplying drive current to said laser diode over a range; and
measuring said intensity signal corresponding to said drive current over said range;

second determining a secondary efficiency of said laser diode, wherein said second determining step comprises:

measuring a sampled amplitude of drive current supplied to said laser diode at a given instance, wherein said sampled amplitude of drive current is within said range;

measuring a sampled amplitude of said intensity signal at said given instance; and comparing said sampled amplitude of drive current to said sampled amplitude of said intensity signal; and third comparing said secondary efficiency to said initial efficiency at said sampled amplitude of drive current.

25. The method of claim 24 and further comprising the step of storing said initial efficiency which varies in accordance with the drive current.

* * * * *

UNITED STATES PATENT AND TRADEMARK OFFICE
CERTIFICATE OF CORRECTION

PATENT NO. : 5,374,973
DATED : December 20, 1994
INVENTOR(S) : Kenneth Y. Maxham
John M. Dugan It is certified that error appears in the above-indentified patent and that said Letters Patent is hereby corrected as shown below:

Col. 1, line 33, delete "FiberGain TM,", insert --FiberGain$^{TM}$--.

Col. 2, line 17, delete "$L_{OUT}$", insert --$L_{OUT1}$--.

Col. 3, line 55, delete "FIGS. 14c", insert --FIGS. 1-4c--.

Col. 4, line 3, after "$L_{OUT3}$", insert --,--.

Col. 4, line 25, delete "$I_{IN1}$", insert --$I_{INT1}$--.

Col. 4, line 28, delete "$I_{IN1}$", insert --$I_{INT1}$--.

Col. 4, line 42, delete "$L_{OUT2}$", insert --$L_{OUT2})$--.

Col. 7, line 22, delete "75,%", insert --75%--.

Col. 9, line 2, delete "$I_{INT}$", insert --$I_{INT1}$--.

Signed and Sealed this

Fourth Day of April, 1995

*Attest:*

BRUCE LEHMAN

*Attesting Officer*   *Commissioner of Patents and Trademarks*